(12) United States Patent
Draxelmayr

(10) Patent No.: US 9,590,577 B2
(45) Date of Patent: Mar. 7, 2017

(54) LINEARIZED HIGH-OHMIC RESISTOR

(71) Applicant: Infineon Technologies AG, Neubiberg (DE)

(72) Inventor: Dieter Draxelmayr, Villach (AT)

(73) Assignee: Infineon Technologies AG, Neubiberg (DE)

( * ) Notice: Subject to any disclaimer, the term of this patent is extended or adjusted under 35 U.S.C. 154(b) by 9 days.

(21) Appl. No.: 13/676,542

(22) Filed: Nov. 14, 2012

(65) Prior Publication Data

US 2014/0132347 A1 May 15, 2014

(51) Int. Cl.
*H03F 1/34* (2006.01)
*H03F 3/45* (2006.01)

(52) U.S. Cl.
CPC ..... *H03F 3/45183* (2013.01); *H03F 3/45475* (2013.01); *H03F 2203/45512* (2013.01); *H03F 2203/45528* (2013.01); *H03F 2203/45544* (2013.01); *H03F 2203/45674* (2013.01)

(58) Field of Classification Search
CPC ........ H01L 29/66166; H03F 1/34; H03G 3/20
USPC ... 330/86, 110, 144, 282, 284; 257/537, 538
See application file for complete search history.

(56) References Cited

U.S. PATENT DOCUMENTS

| | | | | |
|---|---|---|---|---|
| 4,864,162 | A * | 9/1989 | Maoz | 327/581 |
| 6,703,682 | B2 * | 3/2004 | Aswell | 257/536 |
| 7,034,615 | B2 * | 4/2006 | Moon | 330/253 |
| 7,265,616 | B2 * | 9/2007 | Tsuruhata et al. | 330/86 |

* cited by examiner

*Primary Examiner* — Steven J Mottola
(74) *Attorney, Agent, or Firm* — Shumaker & Sieffert, P.A.

(57) ABSTRACT

Representative implementations of devices and techniques provide a linearized high-ohmic resistor. In an example, a quantity of serially connected nonlinear impedances is arranged as a resistance. In one example, the quantity of impedances is applied in an amplifier circuit, between an input of the amplifier and an output of the amplifier, and arranged to set a DC operating point for the amplifier.

23 Claims, 4 Drawing Sheets

LINEARIZED HIGH-OHMIC RESISTOR

BACKGROUND

Applications for reading or amplifying signals of capacitive sources usually require very high impedance input terminal(s), since a lower impedance input may deteriorate the input signal. In such applications, a technique may also be needed to define a DC operating point for the application. This may require using an input component with some ohmic characteristic (i.e., the component can source or sink some current) as well as a very high impedance. For example, it may be desirable to design a MEMs-based microphone, for instance, to include input components with impedance values in excess of 1 GOhm, or even in excess of 100 GOhm. Additionally, it may be desirable for the input/impedance components to be as linear as possible, because non-linear impedance components may produce some rectifying effects, which deteriorate the desired operating point.

Some proposed solutions use a diode, for example, with an operating voltage of zero volts as a resistive component. This can be a simple and inexpensive solution, and at a zero-volt operating point a diode typically has a very high resistance. However, the resistance values of a diode may widely vary, and also may be quite nonlinear. Other solutions with improved linearity include complex closed-loop circuits involving, for example, analog-to-digital and digital-to-analog conversion and/or signal processing.

BRIEF DESCRIPTION OF THE DRAWINGS

The detailed description is set forth with reference to the accompanying figures. In the figures, the left-most digit(s) of a reference number identifies the figure in which the reference number first appears. The use of the same reference numbers in different figures indicates similar or identical items.

For this discussion, the devices and systems illustrated in the figures are shown as having a multiplicity of components. Various implementations of devices and/or systems, as described herein, may include fewer components and remain within the scope of the disclosure. Alternately, other implementations of devices and/or systems may include additional components, or various combinations of the described components, and remain within the scope of the disclosure.

DETAILED DESCRIPTION

Overview

Representative implementations of devices and techniques provide a linearized high-ohmic resistor. In other words, an impedance component is provided that has a very high impedance value that is substantially linear over a wide spectrum of input signals. In one example, a quantity of serially connected nonlinear impedances is arranged to form the impedance component. For instance, in an implementation, the nonlinear impedances are transistor devices, such as metal-oxide-semiconductor field-effect transistor (MOSFET) devices, or the like.

In one implementation, the impedance component includes a voltage divider arranged to bias the nonlinear impedances. In another implementation, the impedance component includes one or more buffers coupled to the quantity of serially connected nonlinear impedances.

In one example, the serially connected nonlinear impedances are applied in an amplifier circuit, in a feedback path between an input of the amplifier and an output of the amplifier, for example, and arranged to set a DC operating point for the amplifier. In other implementations, the serially connected nonlinear impedances are applied in various other circuits and/or applications to fulfill a linear impedance component role (e.g., providing a voltage drop or voltage source, sourcing or sinking a current, as part of a voltage divider, etc.).

Various implementations and arrangements are discussed with reference to electrical and electronics components. While specific components (i.e., transistor device types, resistors, capacitors, buffers, etc.) are mentioned, this is not intended to be limiting, and is for ease of discussion and illustrative convenience. The techniques and devices discussed with reference to a transistor are applicable to any type or number of transistor device designs, structures, and the like (e.g., metal-oxide-semiconductor FET (MOSFET), metal-insulator-semiconductor FET (MISFET), metal-semiconductor FET (MESFET), insulated-gate FET (IGFET), insulated-gate bipolar transistor (IGBT), etc.), as well as other semiconductor devices, and remain within the scope of the disclosure. For ease of discussion, the generic term "transistor device" is used herein for all such devices. Additionally, the techniques and devices discussed with reference to a resistor or resistance are applicable to other types of impedance components or impedance in general. The use of the terms resistor or resistance is not intended to be limiting, and includes components or arrangements having resistance characteristics as well as those also having reactance characteristics.

Implementations are explained in more detail below using a plurality of examples. Although various implementations and examples are discussed here and below, further implementations and examples may be possible by combining the features and elements of individual implementations and examples.

Example Environment

Figure 1A:
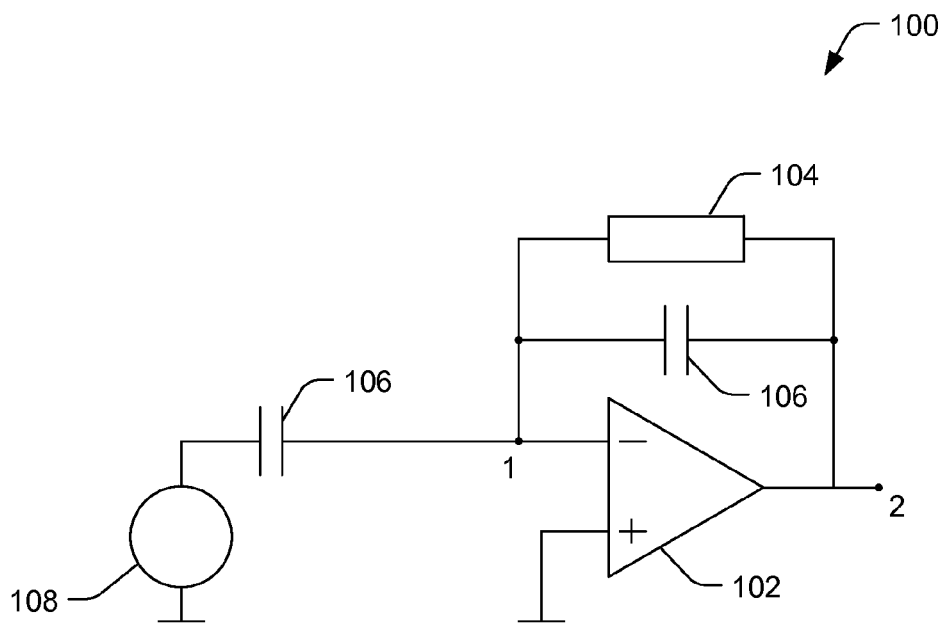
FIG. 1A is a schematic drawing of an example amplifier circuit wherein the techniques and devices described herein may be implemented, according to one example.

FIG. 1A is a schematic drawing of an example amplifier circuit 100 wherein the techniques and devices described herein may be implemented. For example, the circuit 100 represents an environment comprising any and all electrical circuits, or portions of circuits, wherein the techniques and devices described herein may be applied. The techniques, components, and devices described herein with respect to the circuit 100 are not limited to the illustrations in FIGS. 1-4, and may be applied to other designs, types, arrangements, and constructions including other electrical components and/or circuits without departing from the scope of the disclosure. In some cases, additional, fewer, or alternative components may be used to implement the techniques described herein. In various implementations, the circuit 100 may be stand-alone, or it may be a portion of a system, component, structure, or the like.

In an example implementation, as shown in FIG. 1A, a circuit 100 may be an amplifier circuit, and may include an inverting amplifier 102 (or inverting transistor, for example), a resistor (or impedance component) 104, one or more capacitors 106, a source component 108, and the like. In various alternate implementations, the circuit 100 may include additional, fewer, or alternate components (e.g., a non-inverting amplifier, etc.).

In an implementation, as shown in FIG. 1A, the source component 108 may be capacitively coupled to an input of the inverting amplifier 102, via one or more capacitors 106. In the example circuit 100, because of the arrangement of the capacitor 106 at the input of the inverting amplifier 102, it may be desirable that the resistor 104 be a very high impedance component. This may minimize deterioration of an input signal from the source component 108. In one example, it is desirable that the resistor 104 have an impedance value on the order of 1 GOhm to 100 GOhm. In alternate implementations, it may be desirable for the resistor 104 to have a lesser or greater impedance value.

In one implementation, to achieve the high impedance value desired, the resistor 104 is comprised of at least one nonlinear element. In another implementation, the resistor 104 comprises a nonlinear component, such as a transistor device, or the like.

In an example, as shown in FIG. 1A, the circuit 100 may include one or more capacitors 106 coupled in parallel with the resistor 104. For example, the capacitor(s) 106 and the resistor 102 may be arranged in a feedback loop (between the output of the inverting amplifier 102, at node 2, and the signal input of the inverting amplifier 102, at node 1, for example) of an amplifier circuit, such as the one illustrated in FIG. 1A. In one implementation, the resistor 104 and the capacitor 106 are arranged to set, stabilize, and/or adjust a direct-current (DC) operating point for the inverting amplifier 102.

Figure 1B:
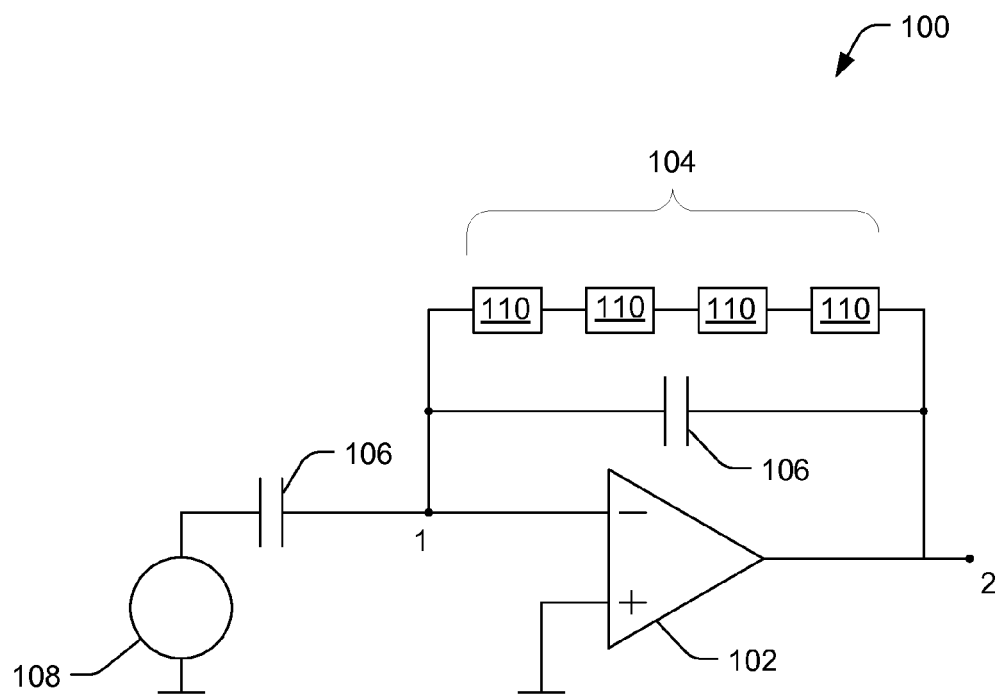
FIG. 1B is a schematic drawing of the example amplifier circuit of FIG. 1A, including a plurality of impedances in a feedback loop, according to an implementation.

To obtain the desired impedance value, the resistor 104 may be comprised of a plurality of serially connected impedances 110. FIG. 1B is a schematic drawing of the example amplifier circuit 100 of FIG. 1A, where the resistor 104 is comprised of a plurality of impedances 110. In an implementation, the plurality of serially connected impedances 110 are coupled between the signal input to the inverting amplifier 102, at node 1 and the output of the inverting amplifier 102, at node 2. Further, in an example, the plurality of serially connected impedances 110 are arranged to set, stabilize, and/or adjust a DC operating point for the inverting amplifier 102.

In one implementation, the impedances 110 comprise nonlinear devices, such as transistor devices, or the like. In the implementation, the plurality of nonlinear devices coupled in series operates as a substantially linear impedance. For example, the plurality of nonlinear devices coupled in series has a more linear impedance characteristic than a single nonlinear impedance handling the same voltage drop.

In one implementation, the plurality of serially connected nonlinear impedances 110 provides a more linear impedance response than an impedance response of a single nonlinear impedance 110 of the plurality of nonlinear impedances, for a same input signal. The linearizing effect comes from the series-connection which leads to a smaller signal swing on each individual impedance device 110, compared to a case with fewer impedance devices 110 (or one impedance device 110) in series, where the voltage difference over each impedance device 110 may be larger. In one illustrative example, a single nonlinear impedance 110 (a bipolar diode at room temperature, for example) may change its small-signal transconductance (gm) value by a factor of approximately 47 when a signal voltage across its terminals changes by 100 mV. In contrast, when a signal voltage across a series-connected plurality of these nonlinear impedances 110 (five diodes, for example) changes by 100 mV, the combined gm for the series changes by a factor of approximately 2. Accordingly, the amplifier circuit 100 as shown in FIG. 1B may behave in a more robust manner (e.g., predictable, consistent, linear, etc.) in the presence of some input signals than the circuit 100 as shown in FIG. 1A, with a single nonlinear resistor 104.

The formula for the transconductance can be given as:

$$gm = I/UT = IO*\exp(UD/UT)/UT$$

where I is the current through the diode, UT is the thermal voltage (kT/q), IO is a technology constant, and UD is the voltage over the diode. A variation in gm, given by a certain voltage variation in UD of dU=100 mV (or 20 mV, which is 100 mV divided by 5 diodes), can be shown as $gm2/gm1 = \exp(dU/(n*UT))$, where n is the number of series connected diodes. For an example of UT=26 mV, this leads to a factor of 47 for n=1 and a factor of 2.16 for n=5.

In an example implementation, one or more of the nonlinear impedances 110 of the plurality of serially connected impedances 110 comprises a transistor device, such as a metal-oxide-semiconductor field-effect transistor (MOSFET), or the like. The use of MOSFET device(s) within the impedance component 200, as shown in FIGS. 2 and 3, for example, may minimize, if not prevent, signal deterioration at the input of the amplifier 102.

Example Impedance Component

Figure 2:
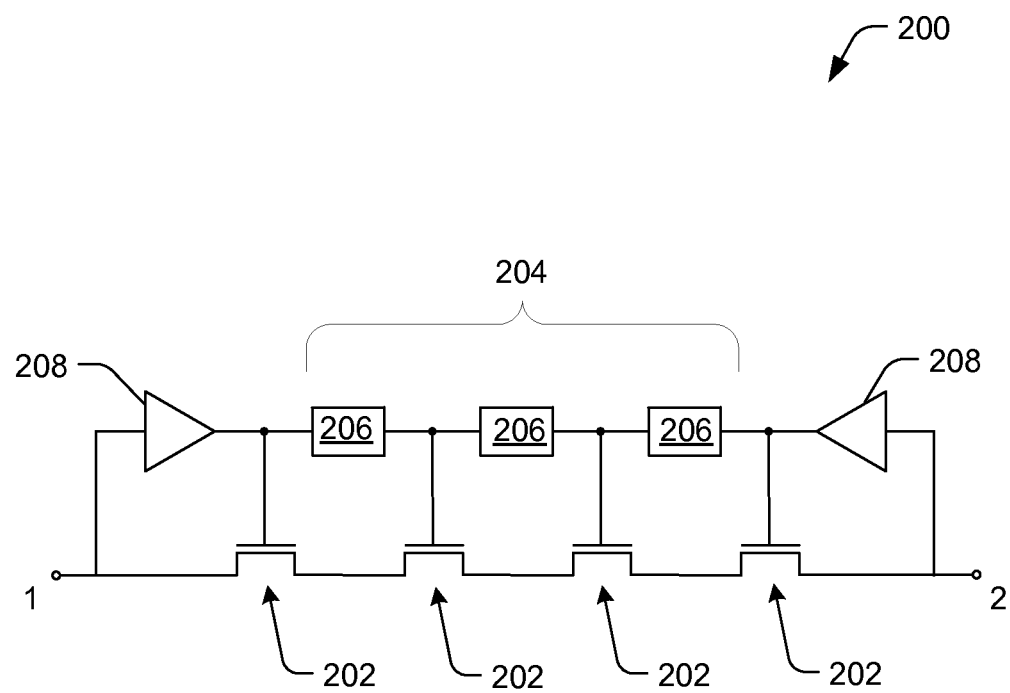
FIG. 2 is a schematic drawing of an impedance component, comprising a plurality of transistor devices, according to one implementation.
Figure 3:
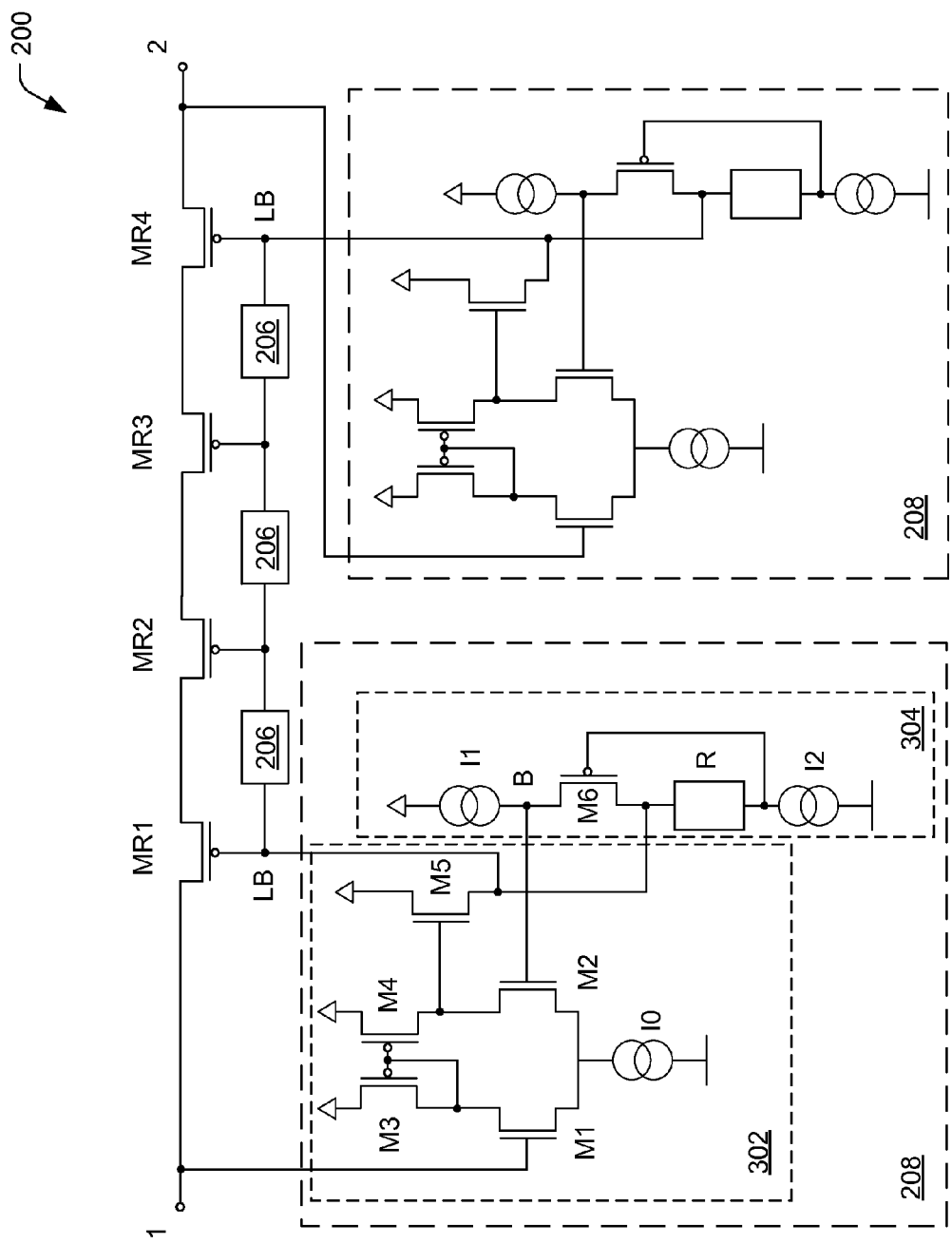
FIG. 3 is a schematic drawing of the impedance component of FIG. 2, showing one example of buffer component detail, according to an implementation.

FIG. 2 is a schematic drawing of an impedance component 200, comprising a plurality of nonlinear impedances 202 (e.g., transistor devices, etc.), according to one implementation. In various implementations, the impedance component 200 represents the resistor 104 of FIG. 1B. For example, the impedance component 200 may be applied to a circuit 100 in like manner as the resistor 104 in FIG. 1B. Accordingly, the nonlinear impedances 110 of FIG. 1B may be represented by example nonlinear impedances 202 (e.g., transistors, etc.) of FIG. 2. This is for ease of discussion, and in alternate implementations, an impedance component 200 may be applied in various other circuits, portions of circuits, applications, designs, and the like.

In an implementation, the impedance component 200 includes a plurality of serially connected nonlinear impedances 202 coupled between at least two terminals (e.g., nodes 1 and 2 of circuit 100, etc.). In the implementation, each of the nonlinear impedances 202 has a very high impedance value (e.g., in the giga-ohms range) and is capable of sourcing and/or sinking electrical current. In one implementation, as discussed above, the plurality of serially connected nonlinear impedances 202 has a more linear impedance response characteristic when operated together in series, than the impedance characteristic of any single nonlinear impedance 202 of the plurality of nonlinear impedances.

In another implementation, as shown in FIG. 2, the impedance component 200 includes a voltage divider 204 arranged to divide a voltage between the two terminals (e.g., nodes 1 and 2) substantially equally, to bias the nonlinear impedances 202. For example, the voltage divider 204 may be comprised of a quantity of resistors 206 or other types of resistances/impedances. In an example, the resistors 206 have impedance values in the kilo-ohm or tens of kilo-ohms range. In alternate implementations, the resistors 206 may have smaller or greater impedance values.

In an implementation, the voltage divider 204 is arranged to divide the voltage between the at least two terminals (e.g., nodes 1 and 2) to result in one or more predetermined voltage values. For example, the predetermined voltage value(s) may be used to bias the nonlinear impedances 202. In one implementation, the nonlinear impedances 202 are biased substantially equally, based on the voltage divider 204.

In one example, as shown in FIG. 2, one or more of the nonlinear impedances 202 comprise a transistor device. In an implementation, each of the nonlinear impedances 202 of the plurality of serially connected nonlinear impedances 202 comprises a transistor device, and a gate terminal of each transistor device is biased such that each transistor sees approximately the same gate overdrive. This condition may promote the transistors to operate with substantially uniform operating characteristics.

In an implementation, one or more of the nonlinear impedances 202 comprise a metal-oxide-semiconductor field-effect transistor (MOSFET) device, having a minimal silicon footprint. In an implementation, a gate terminal of the MOSFET device is biased based on a voltage at a node of the voltage divider 204.

In one implementation, the impedance component 200 includes one or more buffers 208. For example, at least one of the buffers 208 may include a simple buffer, a level-shifting buffer, or the like. In various implementations, the buffers 208 may be arranged to protect the circuit 100 against a low-resistive load being applied to the terminals of the impedance component 200 (e.g., nodes 1 and 2). Alternately, the buffers 208 may be arranged to assist in providing the bias to the transistors 202, as discussed further below.

In an implementation, a first buffer 208 is coupled to a first end of the voltage divider 204 and to one of the at least two terminals (e.g., nodes 1 and 2) and a second buffer 208 is coupled to a second end of the voltage divider 204 and to another of the at least two terminals (e.g., nodes 1 and 2).

FIG. 3 is a schematic drawing of the impedance component 200 of FIG. 2, showing additional detail (of the buffers 208, for example) according to one example implementation. In the illustration of FIG. 3, the nonlinear impedances 202 are labeled individually as MR1, MR2, MR3, and MR4.

In an implementation, as shown in FIG. 3, at least one buffer 208 comprises an electrical circuit having one or more transistors (i.e., M1, M2, M3, M4, M5, and M6). For clarity in the drawing, only one of the buffers 208 in FIG. 3 includes labels on the elements within the buffer 208. In the example implementation, multiple buffers 208 of the impedance component 200 are substantially the same, as shown in FIG. 3, including corresponding elements and functions. In alternate implementations, an impedance component 200 may include additional or fewer buffers 208, or additional or alternate components and elements. In one implementation, multiple buffers 208 of an impedance component 200 may have varying design and type.

The circuit illustrated in FIG. 3 of an impedance component 200 shows one example of how desired resistance/impedance values may be assigned to the nonlinear impedances (MR1-MR4). In alternate implementations, other techniques may be used to set and/or adjust the impedance values of the nonlinear impedances (MR1-MR4). In the example implementation, however, the input signal is replicated (by the buffers 208, for example), buffered (also by the buffers 208, for example), and output (via an output stage, for example) to the gate terminals of the nonlinear impedances (MR1-MR4) with a predefined voltage shift.

In the implementation, as shown in FIG. 3, at least one buffer 208 includes a buffer portion 302 and an output stage portion 304. An amplifier section (including M3, M4, and M5, for example) of the buffer portion 302 is arranged to make/keep the voltage at node B substantially equal to the voltage at the input (at node 1). The output stage portion 304 includes at least one transistor (e.g., M6) biased by a first current source (e.g., I1) and at least one reference resistor (e.g., R) biased by a second current source (e.g., I2). In an implementation, the output stage portion 304 is arranged to provide a bias to at least one of the nonlinear impedances (MR1-MR4). For example, the bias to impedances MR1 and MR4 may be applied at the node(s) LB.

Consequently, the voltage at node(s) LB may be defined by the voltage at node B plus (or minus) the voltage drop over M6. The voltage drop over M6 is given by a "diode voltage" over M6 minus the voltage drop over reference resistor R. As a result, the signal at the node(s) LB (i.e., the bias provided by the output stage 304) is a buffered version of the signal at the input node, plus (or minus) a predefined voltage drop.

In this case, the predefined voltage drop is given as a diode voltage (M6 biased by I1) minus a resistive drop (R biased by I2). As mentioned above, the bias to impedances MR1 and MR4 may be applied at node(s) LB. In an alternate implementation, an additional impedance (not shown) may be included between the output of the buffer(s) 208 and the first gate/element 206 (e.g., prior to node LB). This additional impedance may have a value approximately equal to half the impedance value of resistor 206. Intermediate transistors MR2 and MR3 receive intermediate voltages at their respective gates, based on the voltage divider 204, comprised of a plurality of voltage dividing resistors 206, as shown in the example of FIG. 3.

Such a "high-ohmic resistor" configuration as herein described (a diode voltage minus a resistive drop) is well suited to provide a predefined "on"-resistance of transistors MR1-MR4. In alternate implementations, other techniques and/or devices may be used to set or adjust the desired resistance/impedance values of the nonlinear impedances (MR1-MR4).

Different configurations for a circuit 100 or an impedance component 200 may be possible with different implementations. In alternate implementations, various other combinations and designs of circuit 100 or the impedance component 200 are also within the scope of the disclosure. The variations may have fewer elements than illustrated in the examples shown in FIGS. 1-4, or they may have more or alternative elements than those shown.

Representative Processes

Figure 4:
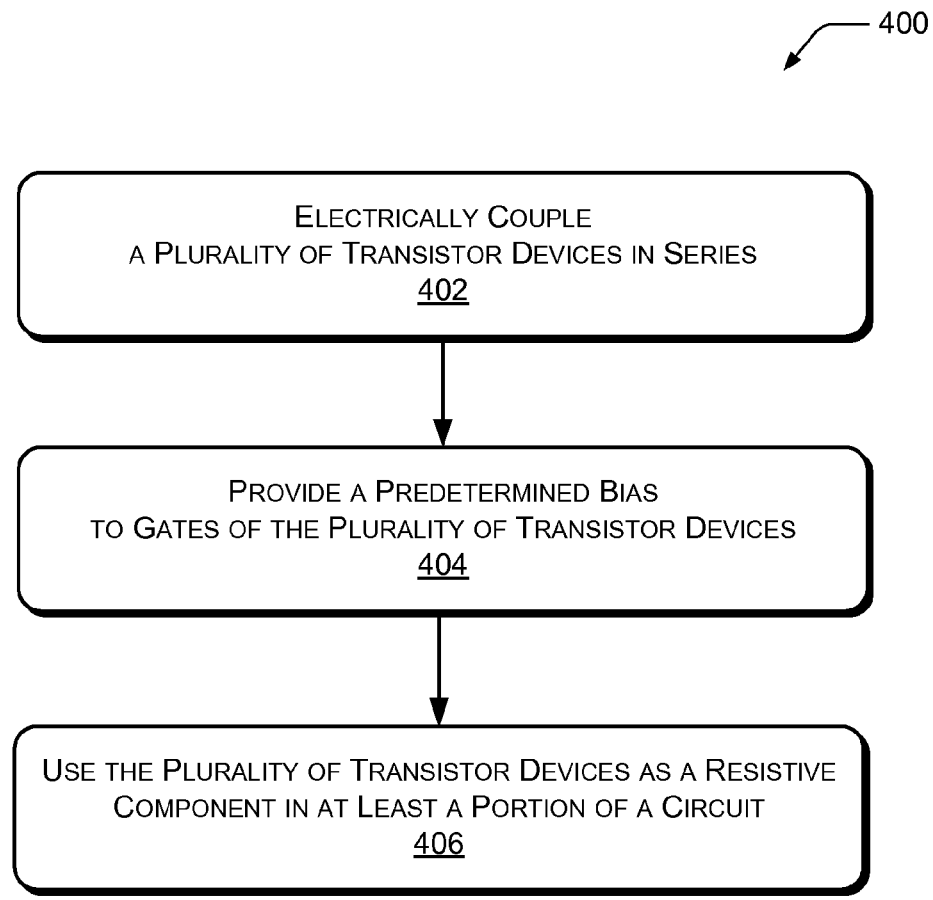
FIG. 4 is a flow diagram illustrating an example process for providing a linearized high-ohmic resistor, according to an implementation.

FIG. 4 is a flow diagram illustrating an example process 400 for providing a linearized high-ohmic resistor (such as impedance component 200, for example), according to various implementations. In alternate implementations, the process includes using a plurality of serially connected nonlinear devices (such as nonlinear devices 110, 202, or MR1-MR4, for example) as the impedance component. In some examples, the nonlinear devices may be biased by supporting components. The process 400 is described with reference to FIGS. 1-3.

The order in which the process is described is not intended to be construed as a limitation, and any number of the described process blocks can be combined in any order to implement the process, or alternate processes. Additionally, individual blocks may be deleted from the process without departing from the spirit and scope of the subject matter described herein. Furthermore, the process can be implemented in any suitable materials, or combinations thereof, without departing from the scope of the subject matter described herein.

At block 402, the process includes electrically coupling a plurality of nonlinear devices (such as nonlinear devices 110, 202, or MR1-MR4, for example), such as transistor devices, for example, in series. In one implementation, the nonlinear devices comprise MOSFET devices, based on the high impedance of the MOSFET gates and the minimal silicon size (in area/footprint) of the MOSFET devices. In the case of MOSFET devices, the devices may be coupled source-to-drain in the series connection. In alternate implementations, other devices having high impedance values are used for the nonlinear devices.

At block 404, the process includes providing a predetermined bias to gates of the plurality of nonlinear (i.e., transistor) devices. For example, in an implementation, the process includes biasing the gates of the plurality of transistors such that each of the transistors sees approximately a same gate overdrive.

In one implementation, the process includes biasing the gates of the plurality of transistors such that a bias value at a gate of a transistor substantially follows a signal the transistor passes through a channel of the transistor. For example, the bias signal at the gate of the transistor may be a may be a buffered and/or voltage shifted version of the signal passed through that transistor. Accordingly, the bias value may comprise the transistor-passed signal with a predetermined offset.

In one implementation, the process includes generating a replica of the input signal (i.e., the transistor-passed signal) using one or more buffers (such as buffers 208, for example) and a voltage divider (such as voltage divider 204, for example), adding an offset to the replica, and providing the offset replica to the gates. For example, the offset may be added to the replica based on a level-shift in the buffer(s).

In an alternate implementation, the process includes biasing the gates of the plurality of transistors using an individual source sensor and/or drain sensor associated with each of the plurality of transistors. In various implementations, the source and/or drain sensors may be coordinated such that the biasing of the gates is uniform and/or consistent. In other implementations, the biasing may be based on other operational or environmental factors.

At block 406, the process includes using the plurality of transistor devices as a resistive component in at least a portion of a circuit (such as circuit 100, for example). In various implementations, the plurality of transistor devices may be used as a resistive component in various applications where a very high-ohmic impedance is desired, such as a capacitive input amplifier circuit, or the like.

In one implementation, the process includes assigning a predetermined resistance value to the plurality of serially connected transistor devices. For example, in an implementation, the predetermined resistance value comprises a diode voltage drop reduced or increased by a voltage drop over a reference impedance. In alternate implementations, the predetermined resistance value includes fewer, additional, or alternate elements and/or components.

In alternate implementations, other techniques may be included in the process 400, in various combinations, and remain within the scope of the disclosure.

CONCLUSION

Although the implementations of the disclosure have been described in language specific to structural features and/or methodological acts, it is to be understood that the implementations are not necessarily limited to the specific features or acts described. Rather, the specific features and acts are disclosed as representative forms of implementing example devices and techniques.

What is claimed is:

1. A device, comprising:
  a plurality of serially connected nonlinear impedances coupled between at least two terminals;
  a voltage divider arranged to divide a voltage between the at least two terminals substantially equally, to bias the nonlinear impedances;
  a buffer coupled to a first end of the voltage divider and to one of the at least two terminals; and
  wherein the buffer comprises an amplifier portion and an output stage portion, the output stage portion having a transistor biased by a first current source and a reference resistor biased by a second current source.

2. The device of claim 1, wherein one or more of the nonlinear impedances of the plurality of serially connected nonlinear impedances comprises a metal-oxide-semiconductor field-effect transistor (MOSFET) device.

3. The device of claim 2, wherein a gate terminal of the MOSFET device is biased based on a voltage at a node of the voltage divider.

4. The device of claim 1, wherein each of the nonlinear impedances of the plurality of serially connected nonlinear impedances comprises a transistor device, and wherein a gate terminal of each transistor device is biased such that each transistor sees approximately a same gate overdrive.

5. The device of claim 1, wherein the plurality of serially connected nonlinear impedances provides a more linear impedance response than an impedance response of a single nonlinear impedance of the plurality of nonlinear impedances, for a same input signal.

6. The device of claim 1, the voltage divider further comprising a plurality of resistors.

7. The device of claim 1, wherein the voltage divider is arranged to divide the voltage between the at least two terminals to result in one or more predetermined voltage values.

8. The device of claim 1, wherein the buffer comprises a simple buffer or a level-shifting buffer.

9. The device of claim 1, wherein the buffer comprises an electrical circuit having one or more transistors.

10. The device of claim 1, wherein the output stage portion is arranged to provide a bias to at least one of the plurality of nonlinear impedances, the bias comprising a buffered version of an input signal increased or reduced by a diode voltage drop reduced or increased by a voltage drop over the reference resistor.

11. A circuit, comprising:
  an inverting amplifier;
  a signal source capacitively coupled to a first input of the inverting amplifier;
  a plurality of serially connected transistor devices coupled between the first input of the inverting amplifier and an output of the inverting amplifier, the plurality of transistor devices arranged to set a direct-current (DC) operating point for the inverting amplifier; and one or more buffer devices arranged to replicate a signal at the first input of the inverting amplifier.

12. The circuit of claim 11, further comprising a capacitance coupled in parallel with the plurality of transistor devices.

13. The circuit of claim 11, further comprising a plurality of voltage dividing resistors arranged to generate gate signals for the plurality of transistor devices.

14. The circuit of claim 11, the first input of the inverting amplifier further including a metal-oxide-semiconductor field-effect transistor (MOSFET) device gate.

15. The circuit of claim 11, wherein the plurality of transistor devices is arranged to operate as a substantially linear impedance.

16. A method, comprising:

electrically coupling a plurality of transistor devices in series;

providing a predetermined bias to gates of the plurality of transistor devices such that a bias value at a gate of a transistor device of the plurality of transistor devices substantially follows a signal the transistor device passes through a channel of the transistor device; and using the plurality of transistor devices as a resistive component in at least a portion of a circuit.

17. The method of claim 16, further comprising biasing the gates of the plurality of transistors such that each of the transistors sees approximately a same gate overdrive.

18. The method of claim 16, wherein the bias value comprises the signal with a predetermined offset.

19. The method of claim 16, further comprising generating a replica of the signal using one or more buffers and a voltage divider, adding an offset to the replica, and providing the offset replica to the gates.

20. The method of claim 16, further comprising assigning a predetermined resistance value to the plurality of serially connected transistor devices.

21. The method of claim 20, wherein the predetermined resistance value is determined based on a diode voltage drop reduced or increased by a voltage drop over a reference impedance.

22. The device of claim 1, wherein the buffer is further coupled to a gate of one of the nonlinear impedances.

23. The device of claim 1, wherein the buffer is a single input single output buffer.

* * * * *